US012713817B2

(12) United States Patent
Kim et al.

(10) Patent No.: US 12,713,817 B2
(45) Date of Patent: Aug. 18, 2026

(54) DISPLAY DEVICE INCLUDING HIGH REFRACTIVE PATTERN

(71) Applicant: Samsung Display Co., Ltd., Yongin-si (KR)

(72) Inventors: Taeho Kim, Yongin-si (KR); Seungyeon Jeong, Yongin-si (KR); Hyeoji Kang, Yongin-si (KR); Su Jeong Kim, Yongin-si (KR); Mihwa Lee, Yongin-si (KR); Hongyeon Lee, Yongin-si (KR); Sunggyu Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 436 days.

(21) Appl. No.: 18/318,972

(22) Filed: May 17, 2023

(65) Prior Publication Data

US 2024/0008348 A1 Jan. 4, 2024

(30) Foreign Application Priority Data

Jun. 29, 2022 (KR) ........................ 10-2022-0080035

(51) Int. Cl.

| | |
|---|---|
| ***H10K 59/80*** | (2023.01) |
| ***G06F 3/041*** | (2006.01) |
| ***H10K 59/40*** | (2023.01) |

(52) U.S. Cl.

CPC ........... *H10K 59/879* (2023.02); *H10K 59/40* (2023.02); *H10K 59/873* (2023.02); *H10K 59/8792* (2023.02); *G06F 3/0412* (2013.01)

(58) Field of Classification Search

None

See application file for complete search history.

(56) References Cited

U.S. PATENT DOCUMENTS

| | | | | |
|---|---|---|---|---|
| 11,037,997 | B2 | 6/2021 | Koo et al. | |
| 11,195,884 | B2 | 12/2021 | Kim et al. | |
| 11,672,143 | B2 | 6/2023 | Choi et al. | |
| 2020/0243802 | A1* | 7/2020 | Ju | G06F 3/0446 |
| 2020/0258946 | A1* | 8/2020 | Kim | H10K 59/874 |

(Continued)

FOREIGN PATENT DOCUMENTS

| | | |
|---|---|---|
| KR | 10-2020-0006206 | 1/2020 |
| KR | 10-2020-0075597 | 6/2020 |

(Continued)

*Primary Examiner* — Nduka E Ojeh

(74) *Attorney, Agent, or Firm* — Womble Bond Dickinson (US) LLP

(57) ABSTRACT

A display device includes a display panel, a sensor layer on the display panel, and a light control layer on the sensor layer. The display panel includes a first pixel area emitting a first light and a second pixel area emitting a second light having a light emission wavelength different from a light emission wavelength of the first light, a light emitting element on a base substrate, and an encapsulation layer on the light emitting element. The light control layer includes a high refractive pattern that overlaps the first pixel area, does not overlap the second pixel area, and includes a first colorant, and an overcoat layer covering the high refractive pattern and overlapping the first pixel area and the second pixel area. A refractive index of the high refractive pattern is higher than a refractive index of the overcoat layer.

20 Claims, 8 Drawing Sheets

(56) References Cited

U.S. PATENT DOCUMENTS

| | | | | |
|---|---|---|---|---|
| 2020/0266382 | A1 | 8/2020 | Seo et al. | |
| 2020/0292859 | A1* | 9/2020 | Lee | H10K 59/8792 |
| 2021/0175468 | A1* | 6/2021 | Lee | H10K 59/8731 |
| 2022/0140283 | A1* | 5/2022 | Kim | H10K 59/38 257/40 |
| 2023/0217701 | A1* | 7/2023 | Shin | H10K 59/8792 345/174 |

FOREIGN PATENT DOCUMENTS

| | | |
|---|---|---|
| KR | 10-2020-0097373 A | 8/2020 |
| KR | 10-2020-0100901 | 8/2020 |
| KR | 10-2020-0129302 | 11/2020 |
| KR | 10-2021-0055858 A | 5/2021 |

* cited by examiner

DD
AR
OC
BM
DP
DP-ED
TFE
INF
OH
PDL
DP-CL
BS
YR
YR1
YR2
NPXA
PXA-B
PXA-G
PXA-R
EL1 HTR EML-B ETR EL2 CPL
EL1 HTR EML-G ETR EL2 CPL
EL1 HTR EML-R ETR EL2 CPL
ED-1
ED-2
ED-3
ED
EML-R
EML-B
EML-G
EML
OL
SP2
CN
SP1
IL
BS-TU
TU
I
I'
DR1
DR2
DR3

DISPLAY DEVICE INCLUDING HIGH REFRACTIVE PATTERN

CROSS-REFERENCE TO RELATED APPLICATION(S)

This application claims priority to and benefits of Korean Patent Application No. 10-2022-0080035 under 35 U.S.C. § 119, filed on Jun. 29, 2022, in the Korean Intellectual Property Office (KIPO), the entire contents of which are incorporated herein by reference.

BACKGROUND

1. Technical Field

The disclosure relates to a display device with improved display efficiency.

2. Description of the Related Art

Various display devices that are applied to multimedia devices, such as televisions, mobile phones, tablet computers, and game devices, are being developed. A display device includes a variety of optical functional layers to provide a color image with excellent quality to a user.

Recently, researches on a thin display device are being conducted to implement various types of display devices, such as a display device including a curved surface, a rollable display device, or a foldable display device. The thin display device is implemented by reducing the number of optical functional layers and employing an optical functional layer having multiple functions.

SUMMARY

The disclosure provides a display device capable of reducing a reflection of an external light, improving a color gamut, and improving optical characteristics.

Embodiments of the disclosure provide a display device that may include a display panel, a sensor layer disposed on the display panel, and a light control layer disposed on the sensor layer. The display panel may include a first pixel area emitting a first light and a second pixel area emitting a second light, a light emission wavelength of the second light being different from a light emission wavelength of the first light, a light emitting element disposed on a base substrate, and an encapsulation layer disposed on the light emitting element. The light control layer may include a high refractive pattern that overlaps the first pixel area in a plan view, does not overlap the second pixel area in a plan view, and includes a first colorant, and an overcoat layer covering the high refractive pattern and overlapping the first pixel area and the second pixel area in a plan view. A refractive index of the high refractive pattern may be higher than a refractive index of the overcoat layer.

The first light may be a red light, and the second light may be a blue light.

The display panel may further include a light blocking area defined adjacent to each of the first pixel area and the second pixel area, and the light control layer may further include a light blocking portion overlapping the light blocking area in a plan view.

The high refractive pattern may not overlap the light blocking portion in a plan view.

The sensor layer may include a sensor base layer disposed on the encapsulation layer, a first conductive layer disposed on the sensor base layer, an inorganic insulating layer disposed on the first conductive layer, a second conductive layer disposed on the inorganic insulating layer, and an organic insulating layer disposed on the second conductive layer. Each of the first conductive layer and the second conductive layer may overlap the light blocking portion in a plan view.

The display panel may further include a third pixel area emitting a third light having a light emission wavelength different from the light emission wavelengths of the first light and the second light, and the high refractive pattern may overlap the first pixel area and the third pixel area in a plan view.

The high refractive pattern may include a first high refractive pattern overlapping the first pixel area and including a first-1 colorant, and a second high refractive pattern overlapping the third pixel area and including a first-2 colorant, and the first-1 colorant and the first-2 colorant may include a same material.

The refractive index of the high refractive pattern may be equal to or greater than about 1.6 and equal to or smaller than about 2.

The refractive index of the overcoat layer may be equal to or greater than about 1.3 and equal to or smaller than about 1.54.

An angle between an upper surface of the sensor layer and a side surface of the high refractive pattern may be equal to or greater than about 50 degrees and equal to or smaller than about 80 degrees.

The first colorant may include at least one of a yellow pigment and a tetraazaporphyrin-based compound.

A light transmittance of the high refractive pattern may be equal to or smaller than about 20% in a wavelength range of equal to or greater than about 380 nm and equal to or smaller than about 480 nm.

The high refractive pattern may further include a base resin and metal oxide nanoparticles. The first colorant and the metal oxide nanoparticles may be dispersed in the base resin.

The display panel may further include an inorganic deposition layer disposed on the light emitting element and including an inorganic material having a refractive index equal to or greater than about 1.0 and a light absorption coefficient equal to or greater than about 0.5.

The light emitting element may include a first electrode disposed on the base substrate, a hole transport region disposed on the first electrode, a light emitting layer disposed on the hole transport region, an electron transport region disposed on the light emitting layer, a second electrode disposed on the electron transport region, and a capping layer disposed on the second electrode.

The light emitting element may include a first light emitting element including a first light emitting layer overlapping the first pixel area in a plan view and emitting the first light, and a second light emitting element including a second light emitting layer overlapping the second pixel area in a plan view and emitting the second light.

Embodiments of the disclosure provide a display device that may include a display panel, a sensor layer disposed on the display panel, and a light control layer disposed on the sensor layer. The display panel may include a first pixel area emitting a first light and a second pixel area emitting a second light, a light emission wavelength of the second light being different from a light emission wavelength of the first light, a light emitting element disposed on a base substrate, an inorganic deposition layer disposed on the light emitting element, including an inorganic material having a refractive index equal to or greater than about 1.0 and a light absorption coefficient equal to or greater than about 0.5, and overlapping the first pixel area and the second pixel area in a plan view, and an encapsulation layer disposed on the inorganic deposition layer. The light control layer may include a high refractive pattern overlapping the first pixel area in a plan view, and an overcoat layer covering the high refractive pattern and overlapping the first pixel area and the second pixel area in a plan view. A refractive index of the high refractive pattern may be higher than a refractive index of the overcoat layer.

The display panel may further include a third pixel area emitting a third light having a light emission wavelength different from the light emission wavelengths of the first light and the second light, and the high refractive pattern may overlap the first pixel area and the third pixel area and may not overlap the second pixel area in a plan view.

Embodiments of the disclosure provide a display device that may include a display panel, a sensor layer disposed on the display panel, and a light control layer disposed on the sensor layer. The display panel may include a first pixel area emitting a first light and a second pixel area emitting a second light, a light emission wavelength of the second light being different from a light emission wavelength of the first light, a light emitting element disposed on a base substrate, and an encapsulation layer disposed on the light emitting element. The light control layer may include a high refractive pattern overlapping the first pixel area in a plan view, having a light transmittance equal to or smaller than about 20% in a wavelength range of equal to or greater than about 380 nm and equal to or smaller than about 480 nm, and including at least one of a yellow pigment and a tetraazaporphyrin-based compound, and an overcoat layer covering the high refractive pattern and overlapping the first pixel area and the second pixel area in a plan view. A refractive index of the high refractive pattern may be higher than a refractive index of the overcoat layer.

The high refractive pattern may further include a base resin in which at least one of the yellow pigment and the tetraazaporphyrin-based compound is dispersed, and metal oxide nanoparticles dispersed in the base resin.

According to the above, a high refractive pattern that includes a colorant absorbing a light in a specific wavelength range may be disposed to overlap a portion of a pixel area in a plan view. Accordingly, the reflection of the external light may be reduced in the display device including the light emitting element, a color gamut may be improved, and optical characteristics may be enhanced.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
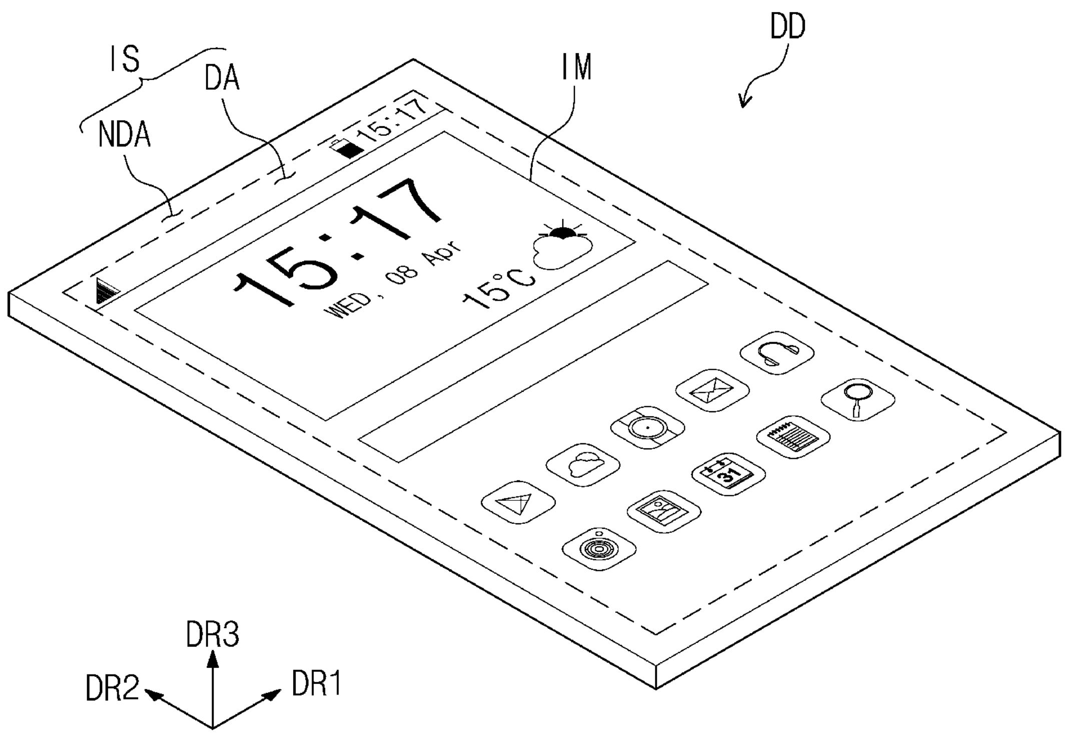
FIG. 1 is a perspective view showing a display device according to an embodiment of the disclosure.

When an element, such as a layer, is referred to as being “on”, “connected to”, or “coupled to” another element or layer, it may be directly on, connected to, or coupled to the other element or layer or intervening elements or layers may be present. When, however, an element or layer is referred to as being “directly on”, “directly connected to”, or “directly coupled to” another element or layer, there are no intervening elements or layers present. For example, the term “directly connected” may mean that two layers or two members are disposed without employing additional adhesive therebetween. To this end, the term “connected” may refer to physical, electrical, and/or fluid connection, with or without intervening elements.

Like numerals refer to like elements throughout. In the drawings, the thickness, ratio, and dimension of components are exaggerated for effective description of the technical content. In the specification and the claims, the term “and/or” is intended to include any combination of the terms “and” and “or” for the purpose of its meaning and interpretation. For example, “A and/or B” may be understood to mean “A, B, or A and B.” The terms “and” and “or” may be used in the conjunctive or disjunctive sense and may be understood to be equivalent to “and/or.”

It will be understood that, although the terms first, second, etc. may be used herein to describe various elements, these elements are not limited by these terms. These terms are only used to distinguish one element from another element. Thus, a first element discussed below could be termed a second element without departing from the teachings of the disclosure. As used herein, the singular forms, “a”, “an” and “the” are intended to include the plural forms as well, unless the context clearly indicates otherwise.

Spatially relative terms, such as “beneath”, “below”, “lower”, “above”, “upper” and the like, may be used herein for ease of description to describe one element or feature’s relationship to another elements or features as shown in the figures.

It will be further understood that the terms “include” and/or “including”, when used in this specification, specify the presence of stated features, integers, steps, operations, elements, and/or components, but do not preclude the presence or addition of one or more other features, integers, steps, operations, elements, components, and/or groups thereof.

In the specification and the claims, the phrase “at least one of” is intended to include the meaning of “at least one selected from the group of” for the purpose of its meaning and interpretation. For example, “at least one of A and B” may be understood to mean “A, B, or A and B.”

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment of the disclosure will be described with reference to accompanying drawings.

FIG. 1 is a perspective view showing a display device DD according to an embodiment of the disclosure. FIG. 1 shows a mobile electronic device as an example of the display device DD. However, the display device DD may be applied to a large-sized electronic item, such as a television set, a monitor, an outdoor billboard, and the like, and a small and medium-sized electronic item, such as a personal computer, a notebook computer, a personal digital assistant, a car navigation unit, a game unit, a smartphone, a tablet computer, a camera, and the like. However, the disclosure is not limited thereto, and the display device DD may be applied to other electronic devices as long as they do not depart from the spirit of the disclosure.

The display device DD may have a cuboidal shape with a thickness in a third direction DR3 in a plan view. However, the disclosure is not limited thereto, and the display device DD may have a variety of shapes.

According to an embodiment, upper (or front) and lower (or rear) surfaces of each member may be defined with respect to a direction in which an image IM is displayed. The front and rear surfaces may be opposite to each other in the third direction DR3, and a normal line direction of each of the upper and lower surfaces may be substantially parallel to the third direction DR3.

Directions indicated by the first, second, and third directions DR1, DR2, and DR3 may be relative to each other and may be changed to other directions.

The display device DD may display the image IM through a display surface IS. The display surface IS may include a display area DA in which an image IM is displayed and a non-display area NDA defined adjacent to the display area DA. The image IM is not displayed through the non-display area NDA. The image IM may include a video or a still image. FIG. 1 shows multiple application icons and a clock widget as examples of the image IM.

The display area DA may have a quadrangular shape. The non-display area NDA may surround the display area DA. However, they are not limited thereto or thereby, and the shape of the display area DA and the shape of the non-display area NDA may be designed relative to each other. The non-display area NDA may not be disposed on a front surface of the display device DD.

The display device DD may be flexible. The term "flexible" used herein may refer to the property of being able to be bent, and the flexible display device may include all structures from a structure that is completely bent to a structure that is bent at the scale of a few nanometers. For example, the display device DD may be a curved display device or a foldable display device, however, it is not limited thereto or thereby. According to an embodiment, the display device DD may be rigid.

Figure 2:
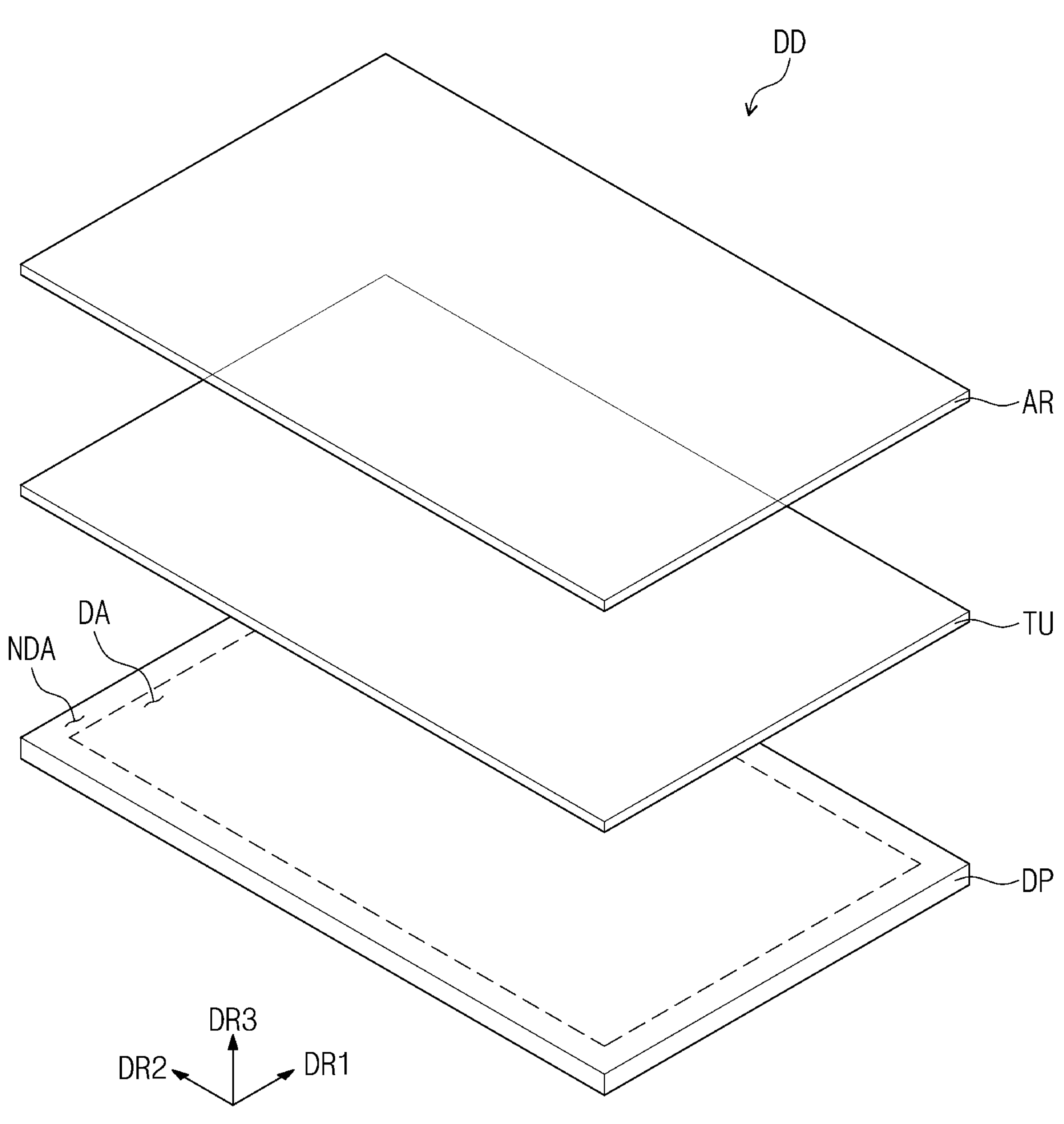
FIG. 2 is an exploded perspective view showing a display device according to an embodiment of the disclosure.

FIG. 2 is an exploded perspective view showing the display device DD according to an embodiment of the disclosure. Referring to FIG. 2, the display device DD may include a display panel DP, a sensor layer TU, and a light control layer AR, which are sequentially stacked in the third direction DR3.

The display device DD may include multiple pixels, and the display panel DP may include multiple pixel areas in an area corresponding to the display area DA. The pixels may correspond to the pixel area PXA-R, PXA-B, and PXA-G (refer to FIG. 3). The pixels may generate lights in response to electrical signals. The display area DA may display the image IM corresponding to the lights generated by the pixels.

According to an embodiment, the display panel DP may be a self-luminous display panel. For example, the display panel DP may be a micro-LED display panel, a nano-LED display panel, an organic light emitting display panel, or a quantum dot light emitting display panel. However, the disclosure is not limited thereto. The display panel DP is not limited thereto or thereby as long as the display panel DP is a self-luminous display panel.

A light emitting layer of the organic light emitting display panel may include an organic light emitting material. A light emitting layer of the quantum dot light emitting display panel may include a quantum dot and/or a quantum rod. The micro-LED display panel may include a micro light-emitting diode element that is a micro light-emitting element, and the nano-LED display panel may include a nano light-emitting diode element. Hereinafter, the organic light emitting display panel will be described as the display panel DP.

The light control layer AR may be disposed on the display panel DP. The light control layer AR may be an anti-reflective layer to reduce a reflectance of an external light incident thereto from the outside. The light control layer AR may selectively pass lights exiting from the display panel DP. The light control layer AR may not include a polarizing layer. Accordingly, a light incident into the display panel DP and the sensor layer TU after passing through the light control layer AR may be an unpolarized light. The display panel DP and the sensor layer TU may receive the unpolarized light from the light control layer AR.

The sensor layer TU may be disposed between the display panel DP and the light control layer AR. The sensor layer TU may obtain information required to generate images in the display panel DP in response to an external input applied thereto. The external input may be a user input. The user input may include various forms of external inputs, such as a part of a user's body, light, heat, pen, or pressure.

Figure 3:
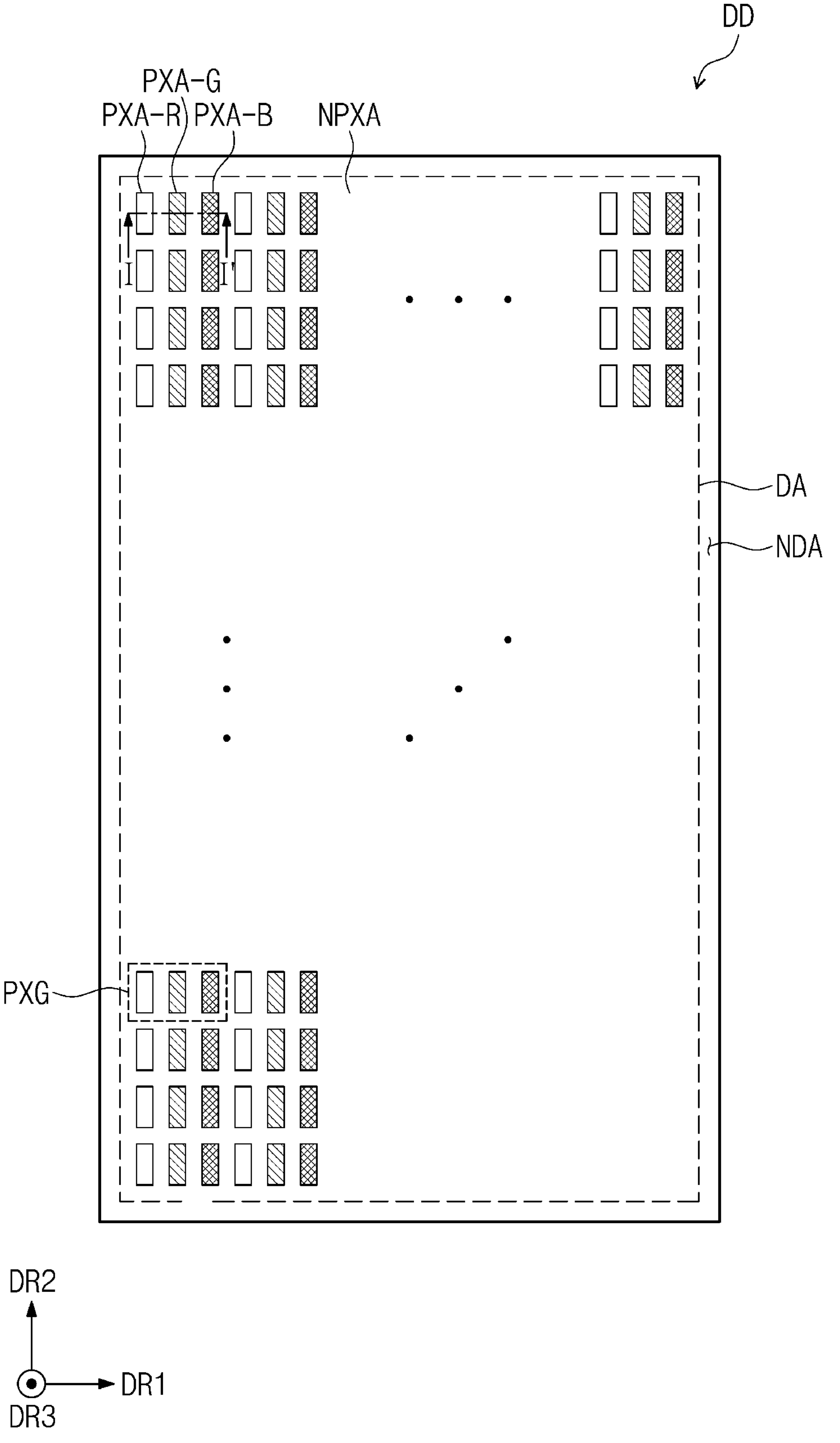
FIG. 3 is a plan view showing a display device according to an embodiment of the disclosure.
Figure 4:
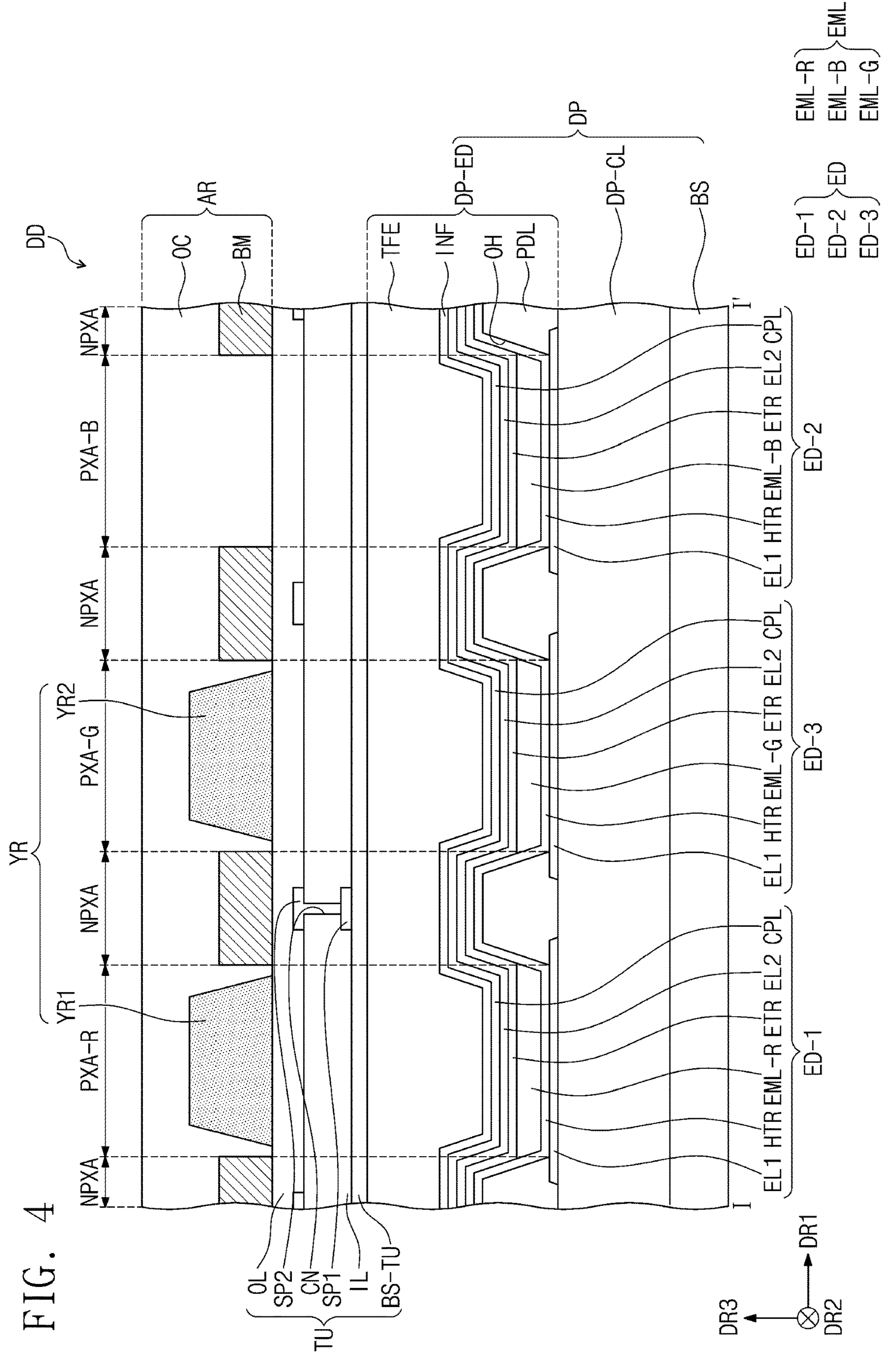
FIG. 4 is a schematic cross-sectional view showing a display device according to an embodiment of the disclosure.
Figure 5:
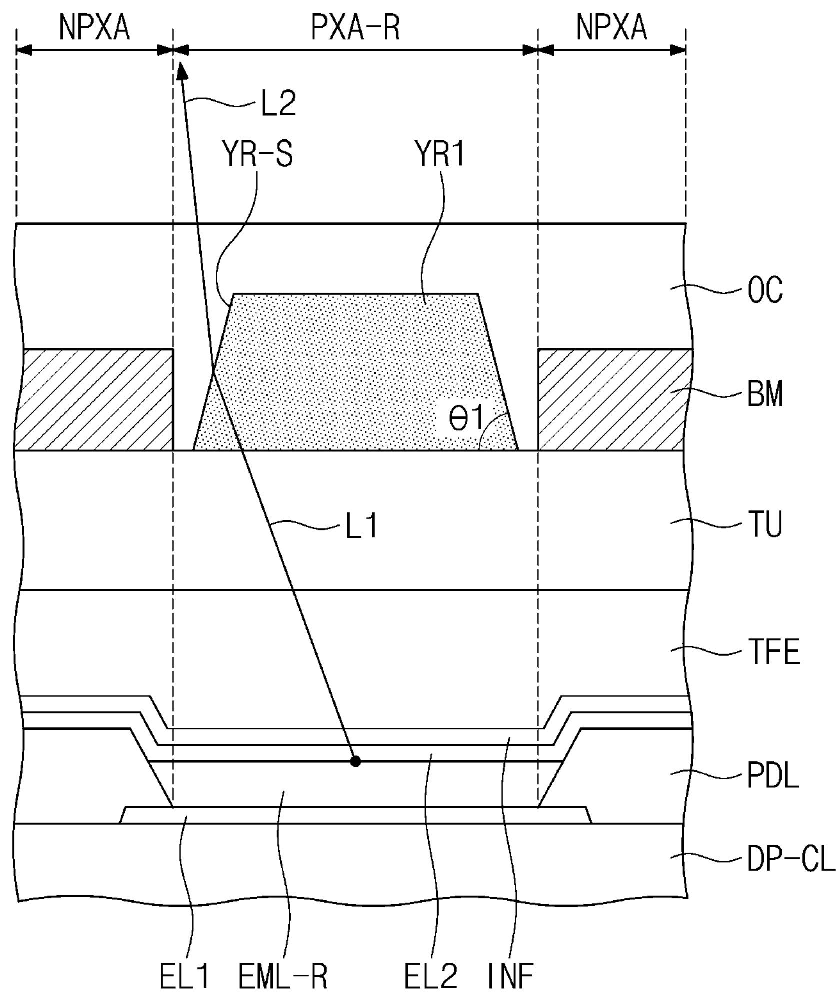
FIG. 5 is an enlarged schematic cross-sectional view of a portion of a display device according to an embodiment of the disclosure.
Figure 5:
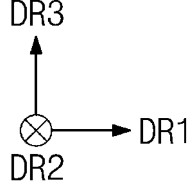

FIG. 3 is a plan view showing the display device DD according to an embodiment of the disclosure. FIG. 4 is a schematic cross-sectional view showing the display device DD according to an embodiment of the disclosure. FIG. 5 is an enlarged schematic cross-sectional view of a portion of the display device DD according to an embodiment of the disclosure. FIG. 4 is a schematic cross-sectional view taken along line I-I' of FIG. 3. FIG. 5 shows a cross-section of a first pixel area and a light blocking area adjacent to the first pixel area of the display device DD.

Referring to FIGS. 3 and 4, the display device DD may include the display panel DP, the sensor layer TU disposed on the display panel DP, and the light control layer AR disposed on the sensor layer TU.

The display panel DP may include a base substrate BS, a circuit layer DP-CL, and a display element layer DP-ED, which are sequentially stacked. The display element layer DP-ED may include a pixel definition layer PDL, light emitting elements ED disposed in pixel openings OH defined through the pixel definition layer PDL, and an encapsulation layer TFE disposed on the light emitting elements ED.

The base substrate BS may be rigid or flexible. The base substrate BS may be a polymer substrate, a plastic substrate, a glass substrate, a metal substrate, or a composite material substrate. The base substrate BS may have a single-layer or multi-layer structure. The base substrate BS may include a synthetic resin film, and the base substrate BS may have a multi-layer structure of multiple synthetic resin films. The synthetic resin film may include a polyimide-based resin, an acrylic-based resin, a vinyl-based resin, an epoxy-based resin, a urethane-based resin, a cellulose-based resin, and a perylene-based resin, however, a material for the synthetic resin film is not limited thereto or thereby.

The circuit layer DP-CL may be disposed on the base substrate BS. The circuit layer DP-CL may include an insulating layer, a semiconductor pattern, a conductive pattern, and a signal line. The circuit layer DP-CL may include multiple transistors (not shown) formed by the semiconductor pattern, the conductive pattern, and the signal line. Each of the transistors (not shown) may include a control electrode, an input electrode, and an output electrode. For example, the circuit layer DP-CL may include a switching transistor and a driving transistor to drive the light emitting element ED.

The display element layer DP-ED may be disposed on the circuit layer DP-CL. The display element layer DP-ED may include the pixel definition layer PDL, the light emitting element ED, and the encapsulation layer TFE.

The light emitting element ED may include multiple light emitting elements ED-1, ED-2, and ED-3. Each of the light emitting elements ED-1, ED-2, and ED-3 may include a first electrode EL1, a hole transport region HTR, a light emitting layer EML-R, EML-G, and EML-B, an electron transport region ETR, a second electrode EL2, and a capping layer CPL. A first light emitting element ED-1 may include a first light emitting layer EML-R overlapping the first pixel area PXA-R. A second light emitting element ED-2 may include a second light emitting layer EML-B overlapping a second pixel area PXA-B. A third light emitting element ED-3 may include a third light emitting layer EML-G overlapping a third pixel area PXA-G in the third direction DR3.

The pixel definition layer PDL may be disposed on the circuit layer DP-CL. The pixel definition layer PDL may be provided with the pixel openings OH defined therethrough. The pixel openings OH may correspond to the pixel areas PXA-R, PXA-B, and PXA-G, respectively. The light blocking area NPXA may be defined between adjacent pixel areas PXA-R, PXA-B, and PXA-G and may correspond to the pixel definition layer PDL.

The pixel definition layer PDL may include an organic resin or an inorganic material. For example, the pixel definition layer PDL may include a polyacrylate-based resin, a polyimide-based resin, silicon nitride ($SiN_x$), silicon oxide ($SiO_x$), or silicon oxynitride ($SiO_xN_y$).

FIG. 4 shows a structure in which the light emitting layers EML-R, EML-G, and EML-B of the light emitting elements ED-1, ED-2, and ED-3 are disposed in the pixel openings OH defined through the pixel definition layer PDL and the hole transport region HTR, the electron transport region ETR, the second electrode EL2, and the capping layer CPL are commonly disposed in the light emitting elements ED-1, ED-2, and ED-3. However, the disclosure is not limited thereto or thereby. Unlike the structure shown in FIG. 4, the hole transport region HTR, the electron transport region ETR, the second electrode EL2, and the capping layer CPL may be disposed in the pixel openings OH defined through the pixel definition layer PDL after being patterned. For example, according to an embodiment, at least one of the hole transport region HTR, the light emitting layers EML-R, EML-G, and EML-B, the electron transport region ETR, the second electrode EL2, and the capping layer CPL of the light emitting elements ED-1, ED-2, and ED-3 may be patterned by an inkjet printing method.

In the light emitting element ED, the first electrode EL1 may be disposed on the circuit layer DP-CL. The first electrode EL1 may be an anode or a cathode. The first electrode EL1 may be a pixel electrode. The first electrode EL1 may be a transmissive electrode, a transflective electrode, or a reflective electrode.

The hole transport region HTR may be disposed between the first electrode EL1 and the light emitting layer EML. The hole transport region HTR may include at least one of a hole injection layer, a hole transport layer, and an electron block layer. The hole transport region HTR may be commonly disposed to overlap the pixel areas PXA-R, PXA-B, and PXA-G and on the pixel definition layer PDL disposed between the pixel areas PXA-R, PXA-B, and PXA-G, however, the disclosure is not limited thereto or thereby. According to an embodiment, the hole transport region HTR may be patterned into multiple portions corresponding to the pixel areas PXA-R, PXA-B, and PXA-G.

The light emitting layer EML may be disposed on the first electrode EL1. The light emitting layer EML may include the first, second, and third light emitting layers EML-R, EML-B, and EML-G. The first light emitting layer EML-R may overlap the first pixel area PXA-R and may emit a first light. The second light emitting layer EML-B may overlap the second pixel area PXA-B and may emit a second light. The third light emitting layer EML-G may overlap the third pixel area PXA-G and may emit a third light. The first, second, and third lights respectively emitted from the light emitting elements ED-1, ED-2, and ED-3 may have different wavelength ranges from each other. For example, the first light may be a red light within a light emission wavelength range equal to or greater than about 625 nm and equal to or smaller than about 675 nm. For example, the second light may be a blue light within a light emission wavelength range equal to or greater than about 410 nm and equal to or smaller than about 480 nm. The third light may be a green light within a light emission wavelength range equal to or greater than about 500 nm and equal to or smaller than about 570 nm.

The electron transport region ETR may be disposed between the light emitting layer EML and the second electrode EL2. The electron transport region ETR may include at least one of an electron injection layer, an electron transport layer, and a hole block layer. The electron transport region ETR may be commonly disposed to overlap the pixel areas PXA-R, PXA-B, and PXA-G and on the pixel definition layer PDL disposed between the pixel areas PXA-R, PXA-B, and PXA-G, however, the disclosure is not limited thereto or thereby. According to an embodiment, the electron transport region ETR may be patterned into multiple portions respectively corresponding to the pixel areas PXA-R, PXA-B, and PXA-G.

The second electrode EL2 may be disposed on the electron transport region ETR. The second electrode EL2 may be a common electrode. The second electrode EL2 may be a cathode or an anode. For example, in case that the first electrode EL1 is an anode, the second electrode EL2 may be a cathode, and in case that the first electrode EL1 is a cathode, the second electrode EL2 may be an anode. The second electrode EL2 may be a transmissive electrode, a transflective electrode, or a reflective electrode.

The capping layer CPL may be disposed on the second electrode EL2. The capping layer CPL may have a single layer or multi-layer structure. According to an embodiment, the capping layer CPL may be an organic layer or an inorganic layer. For example, in case that the capping layer CPL includes an inorganic material, the inorganic material may include SiON, $SiN_x$, $SiO_y$, an alkali metal compound, such as LiF, an alkaline earth metal compound, such as $MgF_2$, or the like. For example, in case that the capping layer CPL includes an organic material, the organic material may include α-NPD, NPB, TPD, m-MTDATA, $Alq_3$, CuPc, TPD15(N4,N4,N4',N4'-tetra (biphenyl-4-yl) biphenyl-4,4'-diamine), TCTA(4,4',4"-Tris (carbazol-9-yl) triphenylamine), or the like or may include an epoxy resin or an acrylate, such as methacrylate, however, it is not limited thereto or thereby.

The capping layer CPL may have a refractive index equal to or greater than about 1.6. For example, the refractive index of the capping layer CPL may be equal or greater than about 1.6 with respect to light having a wavelength range equal to or greater than about 550 nm and equal to or smaller than about 660 nm.

The encapsulation layer TFE may be disposed on the pixel definition layer PDL and may cover the light emitting element ED. The encapsulation layer TFE may be disposed on the capping layer CPL and may fill a portion of the pixel opening OH. As shown in FIG. 4, in case that the light emitting element ED includes an inorganic deposition layer INF, the encapsulation layer TFE may be disposed on the inorganic deposition layer INF. The encapsulation layer TFE may protect the light emitting element ED from moisture and oxygen, and the encapsulation layer TFE may protect the light emitting element ED from a foreign substance, such as dust particles.

FIG. 4 shows the encapsulation layer TFE as a single layer, however, the disclosure is not limited thereto, and the encapsulation layer TFE may include at least one organic layer, or at least one inorganic layer, or may include an organic layer and an inorganic layer. The encapsulation layer TFE may have a thin film encapsulation layer structure including at least one organic layer and at least one inorganic layer. For example, the encapsulation layer TFE may have a structure in which the organic layer and the inorganic layer are alternately stacked with each other, or the inorganic layer, the organic layer, and the inorganic layer are sequentially stacked.

The inorganic layer included in the encapsulation layer TFE may include silicon nitride, silicon oxynitride, silicon oxide, titanium oxide, or aluminum oxide, however, it is not particularly limited. The organic layer included in the encapsulation layer TFE may include an acrylic-based organic layer, however, it is not particularly limited.

The display device DD may include the light blocking area NPXA and the pixel areas PXA-R, PXA-B, and PXA-G. Each of the pixel areas PXA-R, PXA-B, and PXA-G may be an area from which a light generated by a corresponding light emitting element among the light emitting elements ED-1, ED-2, and ED-3 exits. The pixel areas PXA-R, PXA-B, and PXA-G may be spaced apart from each other in a plan view.

Each of the pixel areas PXA-R, PXA-B, and PXA-G may be defined by the pixel definition layer PDL. The light blocking area NPXA may correspond to an area between adjacent pixel areas PXA-R, PXA-B, and PXA-G and may correspond to the pixel definition layer PDL. Each of the pixel areas PXA-R, PXA-B, and PXA-G may correspond to the pixel. The pixel definition layer PDL may be defined to distinguish the light emitting elements ED-1, ED-2, and ED-3 from each other. The light emitting layers EML-R, EML-B, and EML-B of the light emitting elements ED-1, ED-2, and ED-3 may be disposed in the openings OH defined through the pixel definition layer PDL to be distinguished from each other.

The pixel areas PXA-R, PXA-B, and PXA-G may be grouped into multiple groups according to colors of the lights generated by the light emitting elements ED-1, ED-2, and ED-3. The display device DD shown in FIGS. 1 and 2 may include three pixel areas PXA-R, PXA-B, and PXA-G respectively emitting red, blue, and green lights. For example, the display device DD may include a first pixel area PXA-R, a second pixel area PXA-B, and a third pixel area PXA-G, which are distinguished from each other. According to an embodiment, the first pixel area PXA-R may be a red pixel area, the second pixel area PXA-B may be a blue pixel area, and the third pixel area PXA-G may be a green pixel area. In the display device DD, a group including one first pixel area PXA-R, one second pixel area PXA-B, and one third pixel area PXA-G may be referred to as a unit pixel group PXG. Although not shown in figures, at least one of the red pixel area PXA-R, the second pixel area PXA-B, and the third pixel area PXA-G included in the unit pixel group PXG may be provided in plural. For example, the unit pixel group PXG may include two third pixel areas PXA-G, one first pixel area PXA-R, and one second pixel area PXA-B.

According to an embodiment, the light emitting elements ED-1, ED-2, and ED-3 of the display device DD may emit lights having different wavelength ranges from each other. For example, the display device DD may include a first light emitting element ED-1 emitting a red light, a second light emitting element ED-2 emitting a blue light, and a third light emitting element ED-3 emitting a green light. For example, the red pixel area PXA-R, the blue pixel area PXA-B, and the green pixel area PXA-G of the display device DD may correspond to the first light emitting element ED-1, the second light emitting element ED-2, and the third light emitting element ED-3, respectively.

However, the disclosure is not limited thereto or thereby, and the first, second, and third light emitting elements ED-1, ED-2, and ED-3 may emit lights having the same wavelength range, or at least one of the first, second, and third light emitting elements ED-1, ED-2, and ED-3 may emit light having a wavelength range different from the other. For example, all the first, second, and third light emitting elements ED-1, ED-2, and ED-3 may emit blue light.

According to an embodiment, the pixel areas PXA-R, PXA-B, and PXA-G of the display device DD may be arranged in a stripe form. Referring to FIG. 3, each of multiple red pixel areas PXA-R, multiple blue pixel areas PXA-B, and multiple green pixel areas PXA-G may be arranged in the second direction DR2. The red pixel area PXA-R, the green pixel area PXA-G, and the blue pixel area PXA-B may be alternately arranged in the first direction DR1.

In FIGS. 3 and 4, the pixel areas PXA-R, PXA-B, and PXA-G are illustrated as similar in size, however, they are not limited thereto or thereby. According to an embodiment, the sizes of the pixel areas PXA-R, PXA-B, and PXA-G may be different from each other depending on the wavelength ranges of the lights emitted therefrom. The sizes of the pixel areas PXA-R, PXA-B, and PXA-G may be sizes in a plan view.

The arrangement of the pixel areas PXA-R, PXA-B, and PXA-G is not limited to that shown in FIG. 3, and an order in which the red pixel area PXA-R, the blue pixel area PXA-B, and the green pixel area PXA-G are arranged may be provided in various combinations according to characteristics of a display quality required for the display device DD. For example, the pixel areas PXA-R, PXA-B, and PXA-G may be arranged in a pentile form such as PenTile™ or a diamond form such as Diamond Pixel™.

The pixel areas PXA-R, PXA-B, and PXA-G may have different sizes from each other. For example, the size of the green pixel area PXA-G may be smaller than the size of the blue pixel area PXA-B, however, it is not limited thereto or thereby.

Referring to FIG. 4 again, the display panel DP may include the inorganic deposition layer INF disposed on the light emitting elements ED-1, ED-2, and ED-3.

The inorganic deposition layer INF may be disposed on the capping layer CPL. The inorganic deposition layer INF may be disposed directly on the capping layer CPL. The inorganic deposition layer INF may prevent the external light from being reflected by the second electrode EL2 of the light emitting elements ED-1, ED-2, and ED-3. For example, a destructive interference may occur between a light reflected by a surface of the inorganic deposition layer INF and a light reflected by the second electrode EL2, and thus, an amount of the external light reflected by the surface of the second electrode EL2 may be reduced. A thickness of the inorganic deposition layer INF and a thickness of the capping layer CPL may be controlled to allow the destructive interference to occur between the light reflected by the surface of the inorganic deposition layer INF and the light reflected by the second electrode EL2.

The inorganic deposition layer INF may include an inorganic material having a refractive index equal to or greater than about 1.0 and a light absorption coefficient equal to or greater than about 0.5. The inorganic deposition layer INF may be formed by a thermal deposition process and may include an inorganic material having a melting point equal to or smaller than about 1000° C. The inorganic deposition layer INF may include, for example, at least one selected from the group consisting of bismuth (Bi) and ytterbium (Yb). A material for the inorganic deposition layer INF may include bismuth (Bi), ytterbium (Yb), or a deposition material, e.g., a mixture ($Yb_xBi_y$) of Yb and Bi. The encapsulation layer TFE may be disposed directly on at least a portion of the inorganic deposition layer INF.

The light control layer AR may be disposed on the display panel DP. The light control layer AR may absorb a portion of light emitted from the display panel DP and may transmit another portion of the light emitted from the display panel DP, and thus, a color gamut may be improved. The color gamut may be a range of colors that can be represented by a display device. For example, the color gamut may be improved by selectively absorbing a light in a specific wavelength range.

The light control layer AR may be disposed on an entire area of the display element layer DP-ED. The light control layer AR may entirely overlap each of the first light emitting element ED-1, the second light emitting element ED-2, and the third light emitting element ED-3 in the third direction DR3. The light control layer AR may cover a front surface of the display panel DP to protect the display panel DP. The light control layer AR disposed on the display panel DP may not include a polarizing layer and may include a high refractive pattern YR obtained by dispersing a colorant, such as a dye and/or a pigment, in a base resin. As the light control layer AR does not include a polarizing layer, light incident into the display panel DP and the sensor layer TU after passing through the light control layer AR may be an unpolarized light. The display panel DP and the sensor layer TU may receive the unpolarized light from the light control layer AR.

The light control layer AR may include a high refractive pattern YR and an overcoat layer OC. The overcoat layer OC may be disposed on the high refractive pattern YR and may cover the high refractive pattern YR.

The high refractive pattern YR may be disposed to overlap the first pixel area PXA-R. The high refractive pattern YR may entirely overlap the first light emitting element ED-1 in the third direction DR3. The high refractive pattern YR may entirely overlap the first light emitting layer EML-R included in the first light emitting element ED-1 in the third direction DR3.

The high refractive pattern YR may include a first colorant. The high refractive pattern YR may be obtained by dispersing the first colorant in the base resin. The high refractive pattern YR may be obtained by dispersing the dye and/or pigment in the base resin.

The high refractive pattern YR may have a high light absorption rate in a specific wavelength range. The first colorant included in the high refractive pattern YR may have a light absorption rate in a specific wavelength range. The first colorant may have a light absorption rate in at least one wavelength range. Accordingly, the high refractive pattern YR including the first colorant may have a low light transmittance in the specific wavelength range. According to an embodiment, the first colorant may absorb light having a wavelength range equal to or greater than about 380 nm and equal to or smaller than about 480 nm. The first colorant may have a high light absorption rate in the wavelength range equal to or greater than about 380 nm and equal to or smaller than about 480 nm. The first colorant may also have a high light absorption rate in a wavelength range equal to or greater than about 500 nm and equal to or smaller than about 600 nm. In the following descriptions, the expression "the colorant has a high light absorption rate in a certain wavelength range" may mean that the colorant has at least one absorption peak within the certain wavelength range in an absorption spectrum. As the first colorant included in the high refractive pattern YR absorbs light in a specific wavelength range and transmits light in other wavelength range, the reflection of the external light may be prevented, and the color of the light emitted from the display panel DP may be adjusted.

The high refractive pattern YR may have a low light transmittance in a specific wavelength range and may have a high light transmittance in other wavelength range to transmit light. According to an embodiment, the high refractive pattern YR may have a light transmittance smaller than about 5% at a wavelength of about 460 nm. The high refractive pattern YR may have a light transmittance equal to or greater than about 60% and equal to or smaller than about 80% at a wavelength of about 550 nm. The high refractive pattern YR may have a light transmittance equal to or greater than about 70% and equal to or smaller than about 100% at a wavelength of about 650 nm.

The first colorant may include at least one of a dye and a pigment.

According to an embodiment, the first colorant may include a yellow colorant. The first colorant included in the high refractive pattern YR may include at least one of a yellow pigment and a yellow dye. For example, the first colorant included in the high refractive pattern YR may include at least one of a yellow pigment and a tetraazaporphyrin-based compound. The first colorant included in the high refractive pattern YR may include both the yellow pigment and the tetraazaporphyrin-based compound.

According to an embodiment, the high refractive pattern YR may include at least one yellow pigment of C.I. Pigment Yellow (yellow colorant) 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214. For example, the high refractive pattern YR may include C.I. Pigment Yellow 138, C.I. Pigment Yellow 185, or C.I. Pigment Yellow 231.

The high refractive pattern YR may include about 0.01 wt % or more and about 5.00 wt % or less of the first colorant based on a total weight of the high refractive pattern YR. In case that the high refractive pattern YR includes less than about 0.01 wt % of the first colorant, a light in a specific wavelength range may not be sufficiently absorbed, and thus, the color gamut may not be improved. In case that the high refractive pattern YR includes more than about 5.00 wt % of the first colorant, an aggregation of the first colorant may occur.

The high refractive pattern YR may include a base resin in which the first colorant is dispersed. The base resin may be a medium in which the first colorant is dispersed, and may include various resin compositions that are generally referred to as a binder. For example, the base resin may be an acrylic-based resin, a urethane-based resin, a silicone-based resin, a cardo-based resin, or an epoxy-based resin. The base resin may be a transparent resin. In the disclosure, the term "α-based resin", as used herein, may be a resin that includes a functional group of a.

The high refractive pattern YR may further include metal oxide nanoparticles to increase the refractive index. The metal oxide nanoparticles may be dispersed in the base resin. The metal oxide nanoparticles may include at least one of, for example, $TiO_2$, ZnO, and $ZrO_2$. The metal oxide nanoparticles may include at least one of $TiO_2$, ZnO, and $ZrO_2$ or may be obtained by mixing two or more materials selected from $TiO_2$, ZnO, and $ZrO_2$. According to an embodiment, the metal oxide nanoparticles may include at least one precursor of $TiO_2$, ZnO, and $ZrO_2$.

The high refractive pattern YR may have a high refractive index. The high refractive pattern YR may have a refractive index higher than that of the overcoat layer OC disposed thereon. The high refractive pattern YR may have a refractive index equal to or greater than about 1.6. The refractive index of the high refractive pattern YR may be equal to or greater than about 1.6 and equal to or smaller than about 2. As the refractive index of the high refractive pattern YR satisfies the range which is equal to or greater than about 1.6 and equal to or smaller than about 2, a front light-emission efficiency of the light emitted to the outside after sequentially passing through the high refractive pattern YR and the overcoat layer OC may be improved.

The high refractive pattern YR may overlap the first pixel area PXA-R from which the first light is emitted and may not overlap the second pixel area PXA-B from which the second light is emitted. The high refractive pattern YR may overlap the third pixel area PXA-G from which the third light is emitted. The high refractive pattern YR may include a first high refractive pattern YR1 overlapping the first pixel area PXA-R and a second high refractive pattern YR2 overlapping the third pixel area PXA-G. The first high refractive pattern YR1 and the second high refractive pattern YR2 may be patterned to be disposed in the first pixel area PXA-R and the third pixel area PXA-G, respectively, and may be spaced apart from each other in the first direction DR1.

The first high refractive pattern YR1 may include a first-1 colorant, and the second high refractive pattern YR2 may include a first-2 colorant. Each of the first-1 colorant and the first-2 colorant may absorb a light having a wavelength range equal to or greater than about 380 nm and equal to or smaller than about 480 nm. Each of the first-1 colorant and the first-2 colorant may include at least one of a yellow pigment and a yellow dye as in the case of the first colorant described above.

The first-1 colorant and the first-2 colorant may include the same material. According to an embodiment, the first-1 colorant and the first-2 colorant may include the same yellow pigment. The first-1 colorant and the first-2 colorant may include the same tetraazaporphyrin-based compound. A concentration of the first-1 colorant included in the first high refractive pattern YR1 may be equal to a concentration of the first-2 colorant included in the second high refractive pattern YR2. According to an embodiment, since the first high refractive pattern YR1 and the second high refractive pattern YR2 of the display device DD are formed of the same material through the same mask process, the first-1 colorant and the first-2 colorant, which are respectively included in the first high refractive pattern YR1 and the second high refractive pattern YR2, may include the same material and may have the same concentration.

The overcoat layer OC may be disposed on the high refractive pattern YR and may cover the high refractive pattern YR. The overcoat layer OC may entirely overlap the display element layer DP-ED. An upper surface of the overcoat layer OC may define an upper surface of the light control layer AR and may cover a front surface of the display panel DP to protect the display panel DP.

The overcoat layer OC may have a refractive index lower than that of the high refractive pattern YR. The overcoat layer OC may have the refractive index equal to or smaller than about 1.54. The refractive index of the overcoat layer OC may be equal to or greater than about 1.3 and equal to or smaller than about 1.54. As the refractive index of the overcoat layer OC satisfies the range which is equal to or greater than about 1.3 and equal to or smaller than about 1.54, the front light emission efficiency of the light emitted to the outside after sequentially passing through the high refractive pattern YR and the overcoat layer OC may be improved.

The overcoat layer OC may include a base resin and low refractive nanoparticles dispersed in the base resin. The low refractive nanoparticles may include a material to decrease the refractive index of the overcoat layer OC. According to an embodiment, the overcoat layer OC may include an acrylic-based resin, a silicone-based resin, or an epoxy-based resin as the base resin. The overcoat layer OC may include silica particles or hollow silica particles as the low refractive nanoparticles. According to an embodiment, the overcoat layer OC may include a precursor of the silica particles or a precursor of the hollow silica particles as the low refractive nanoparticles.

According to an embodiment, the light control layer AR may include a light blocking portion BM overlapping the light blocking area NPXA in the third direction DR3. The light blocking portion BM may overlap the light blocking area NPXA and may not overlap the first, second, and third pixel areas PXA-R, PXA-B, and PXA-G. For example, the light blocking portion BM may be provided with light blocking openings respectively corresponding to the first, second, and third pixel areas PXA-R, PXA-B, and PXA-G. The light blocking portion BM may prevent a light leakage between pixel areas. The light blocking portion BM may be a light blocking member. The light blocking portion BM may include an organic light blocking material, a black pigment, or a black dye.

As shown in FIG. 4, the high refractive pattern YR may be disposed between the light blocking portion BM. The high refractive pattern YR may be disposed in the light blocking opening defined through the light blocking portion BM. The high refractive pattern YR may not overlap the light blocking portion BM in a plan view. For example, the high refractive pattern YR may overlap some of the pixel areas PXA-R, PXA-B, and PXA-G and may not overlap the light blocking area NPXA, however, it is not limited thereto or thereby. According to an embodiment, the high refractive pattern YR may overlap a portion of the light blocking portion BM. For example, the high refractive pattern YR may overlap the first pixel area PXA-R and the third pixel area PXA-G and portions of the light blocking area NPXA, which are respectively adjacent to the first pixel area PXA-R and the third pixel area PXA-G.

The overcoat layer OC may be filled between the light blocking portions BM spaced apart from each other and between the high refractive pattern YR and the light blocking portion BM. A portion of the overcoat layer OC may be disposed in the light blocking opening. The overcoat layer OC may be disposed on the light blocking portions BM and may be filled between the light blocking portions BM and between the high refractive pattern YR and the light blocking portion BM.

Referring to FIG. 4, the sensor layer TU may be disposed between the display panel DP and the light control layer AR. The sensor layer TU may include a sensor base substrate BS-TU, a first conductive layer SP1, an inorganic insulating layer IL, a second conductive layer SP2, and an organic insulating layer OL. The first conductive layer SP1 may be disposed on the sensor base substrate BS-TU. The inorganic insulating layer IL may cover the first conductive layer SP1 and may be disposed on the sensor base substrate BS-TU and the first conductive layer SP1. The second conductive layer SP2 may be disposed on the inorganic insulating layer IL. The organic insulating layer OL may cover the second conductive layer SP2 and may be disposed on the inorganic insulating layer IL and the second conductive layer SP2.

The sensor base substrate BS-TU may be an inorganic layer and may include one of silicon nitride, silicon oxynitride, and silicon oxide. According to an embodiment, the sensor base substrate BS-TU may be an organic layer including an epoxy resin, an acrylic resin, or an imide-based resin. The sensor base substrate BS-TU may have a single-layer structure or a multi-layer structure of layers stacked in the third direction DR3. The sensor base substrate BS-TU may be disposed directly on the encapsulation layer TFE.

Each of the first conductive layer SP1 and the second conductive layer SP2 may have a single-layer structure or a multi-layer structure of layers stacked in the third direction DR3. The first and second conductive layers SP1 and SP2 having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), or indium zinc tin oxide (IZTO). The transparent conductive layer may include a conductive polymer (e.g., PEDOT), a metal nanowire, or a graphene.

The first and second conductive layers SP1 and SP2 having the multi-layer structure may include multiple metal layers. The metal layers may have a three-layer structure of titanium (Ti)/aluminum (Al)/titanium (Ti). The first and second conductive layers SP1 and SP2 of the multi-layer structure may include at least one metal layer and at least one transparent conductive layer.

The inorganic insulating layer IL may include at least one of aluminum oxide, titanium oxide, silicon oxide, silicon oxynitride, zirconium oxide, and hafnium oxide.

The inorganic insulating layer IL may be provided with a contact hole CN defined therethrough. The first conductive layer SP1 and the second conductive layer SP2 may be electrically connected to each other through the contact hole CN. The contact hole CN may be filled with a material of the second conductive layer SP2. FIG. 4 shows one contact hole CN defined through the inorganic insulating layer IL, however, the number of the contact holes CN is not limited to one. According to an embodiment, multiple contact holes may be defined through the inorganic insulating layer IL.

The organic insulating layer OL may cover the inorganic insulating layer IL and the second conductive layer SP2. The organic insulating layer OL may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The shape of the high refractive pattern and a path of the light emitted from the light emitting element will be described in more detail with reference to FIG. 5. The shape of the high refractive pattern will be described based on the first high refractive pattern YR1 in FIG. 5, and descriptions on the shape of the high refractive pattern may be applied to the second high refractive pattern YR2 in FIG. 4. For example, the high refractive patterns YR1 and YR2 shown in FIG. 4 may have the same shape. FIG. 5 shows the path of light emitted from the first light emitting layer EML-R to the first high refractive pattern YR1 in the first pixel area PXA-R as an example, and descriptions on the path of the light emitted from the first light emitting layer EML-R to the first high refractive pattern YR1 may be applied to the path of the light emitted from the third light emitting layer EML-G to the second high refractive pattern YR2 in the third pixel area PXA-G shown in FIG. 4.

Referring to FIG. 5, in the display device according to the embodiment, a first light L1, which travels in a direction inclined with respect to a vertical direction, e.g., the third direction DR3, rather than traveling in the vertical direction, of the light emitted from the first light emitting layer EML-R may travel through the first high refractive pattern YR1. The first light L1 may be refracted at an interface between the first high refractive pattern YR1 and the overcoat layer OC and may travel in a direction to which a second light L2 travels. The second light L2 may be inclined at a degree smaller than that of the first light L1 with respect to the third direction DR3. For example, since the light emitted from the first light emitting layer EML-R and traveling in the direction inclined with respect to the vertical direction may be refracted at the interface between the first high refractive pattern YR1 and the overcoat layer OC, the inclination degree of the path of the light may be reduced, and thus, the front light emission efficiency may be improved.

The first high refractive pattern YR1 may include a side surface YR-S inclined at a first taper angle θ1 with respect to a reference surface, e.g., the upper surface of the sensor layer TU. The first taper angle θ1 may be equal to or greater than about 50 degrees and equal to or smaller than about 80 degrees. The first taper angle θ1 may be, for example, about 60 degrees. As the first taper angle θ1 satisfies the abovementioned range, the front light emission efficiency of the light traveling to the outside after sequentially passing through the high refractive pattern YR and the overcoat layer OC may be improved.

According to an embodiment, the light transmittance at the specific wavelength range may be controlled depending on a thickness of the first high refractive pattern YR1 and a type and content of the first colorant. The first high refractive pattern YR1 may have a thickness equal to or greater than about 2 micrometers and equal to or smaller than about 4 micrometers.

The first high refractive pattern YR1 may include greater than or equal to about 0.01 wt % and less than or equal to about 5.00 wt % of the first colorant based on the total weight of the first high refractive pattern YR1. In a case where the first high refractive pattern YR1 includes less than about 0.01 wt % of the first colorant, the light in the specific wavelength range may not be sufficiently absorbed, and thus, the color gamut may not be improved. In a case where the first high refractive pattern YR1 includes more than about 5.00 wt % of the first colorant, the aggregation of the first colorant may occur.

As described above, the first high refractive pattern YR1 may include both of the yellow pigment and the tetraazaporphyrin-based compound. Based on a total solid content included in the first high refractive pattern YR1, the first high refractive pattern YR1 may include greater than or equal to about 5 wt % and less than or equal to about 30 wt % of the yellow pigment. Based on the total solid content included in the first high refractive pattern YR1, the first high refractive pattern YR1 may include greater than or equal to about 0.01 wt % and less than or equal to about 5 wt % of the tetraazaporphyrin-based compound.

In the display device according to the embodiment, as the high refractive pattern of the light control layer includes the first colorant absorbing the light at the specific wavelength range, the color gamut of the display device may be improved, and the reflection of the external light may be prevented. For example, according to the embodiment of the display device, the high refractive pattern including the colorant may be disposed to overlap the first pixel area emitting a red light and the third pixel area emitting a green light and may not overlap the second pixel area emitting a blue light. Accordingly, the display device may have a high display efficiency and an excellent external light reflectance compared with a case in which a layer including the colorant is formed to overlap the entire pixel area. According to the embodiment of the display device, the high refractive pattern that includes the colorant with the high light absorption rate in the wavelength range equal to or greater than about 380 nm and equal to or smaller than about 480 nm may be patterned and disposed in the red pixel area and the green pixel area. Accordingly, the light in a short wavelength region may be absorbed to prevent the light outside the target range from leaking and to provide high transmittance with respect to the red light and the green light. Thus, the color gamut may be improved, and the high display efficiency may be obtained.

Figure 6:
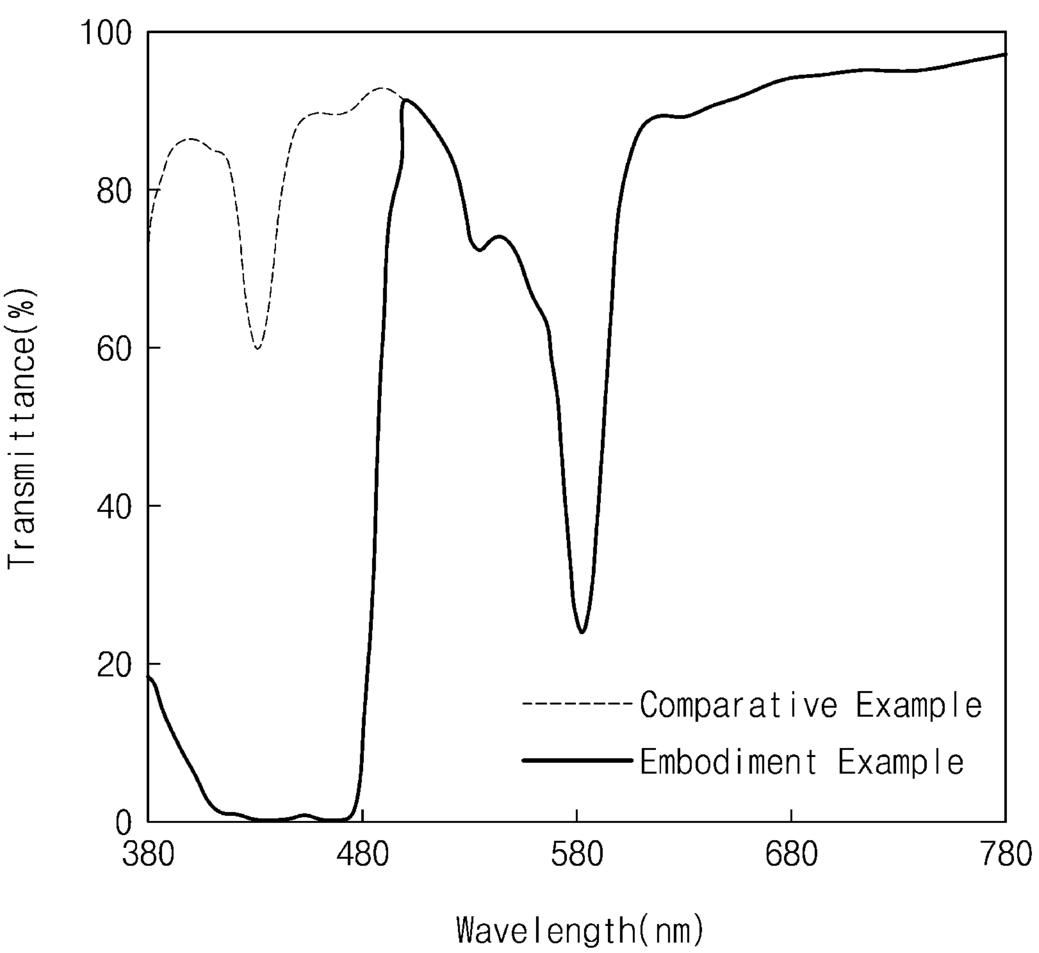
FIG. 6 is a graph of transmission spectra for each wavelength of display devices according to an embodiment of the disclosure and a comparative example.
Figure 7A:
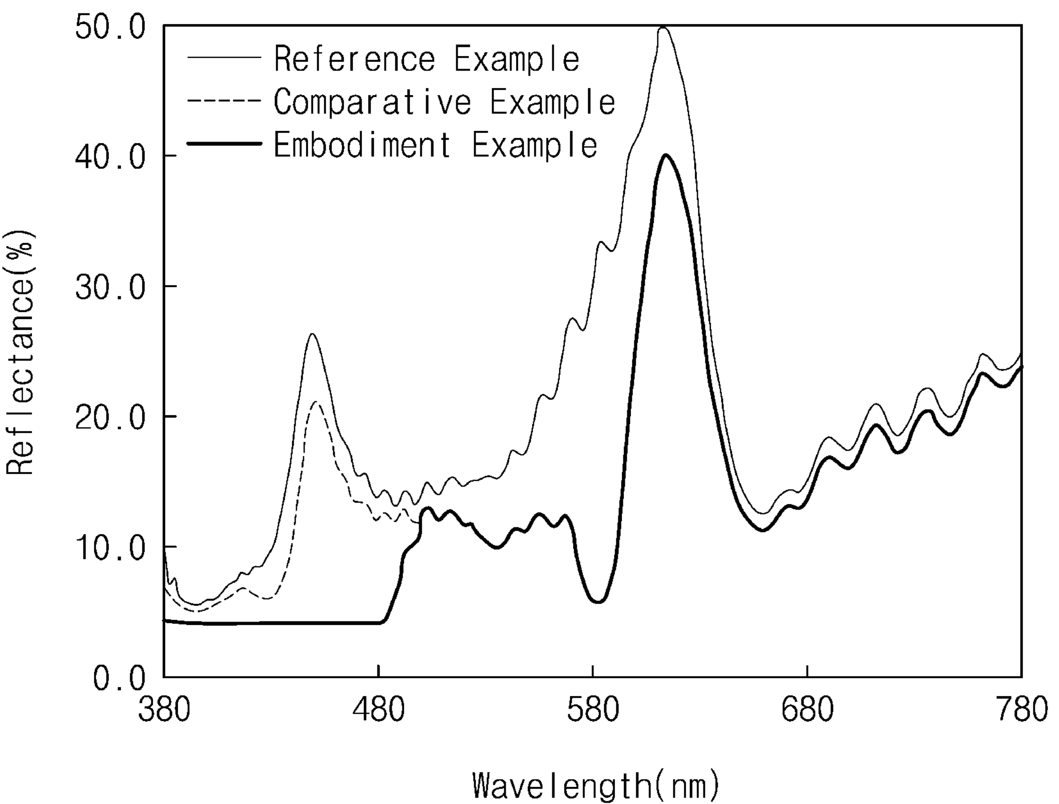
FIGS. 7A and 7B are graphs of reflection spectra for each wavelength of display devices according to an embodiment of the disclosure and a comparative example, respectively.
Figure 7B:
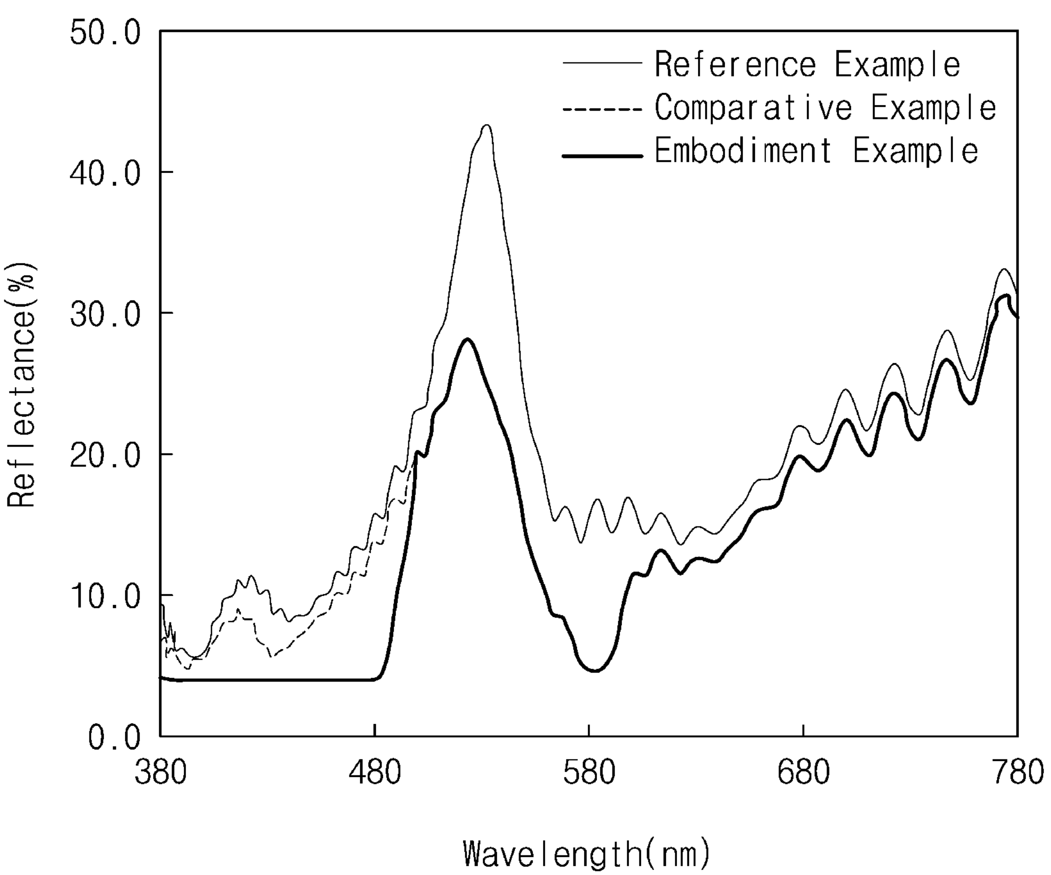

FIG. 6 is a graph of transmission spectra for each wavelength of display devices according to an embodiment of the disclosure and a comparative example. FIGS. 7A and 7B are graphs of reflection spectra for each wavelength of display devices according to an embodiment of the disclosure, a comparative example, and a reference example. The embodiment example of FIGS. 6, 7A, and 7B shows the transmission spectra and the reflection spectra of the display device that includes the light control layer including the high refractive pattern respectively overlapping each of the first pixel area and the third pixel area and the overcoat layer covering the high refractive pattern as shown in FIG. 4. Different from the embodiment example, the comparative examples in FIGS. 6, 7A, and 7B show the transmission spectra and the reflection spectra of the display device in which the high refractive pattern including the colorant is formed to entirely overlap the first pixel area, the second pixel area, and the third pixel area. In FIGS. 7A and 7B, different from the embodiment example, the reference example shows reflection spectra of the display device in which the light control layer is not formed on the sensor layer. FIG. 7A shows the reflection spectra for each wavelength of a portion corresponding to the first pixel area in the display device according to the embodiment example, the comparative example, and the reference example. FIG. 7B shows the reflection spectra for each wavelength of a portion corresponding to the third pixel area in the display device according to the embodiment example, the comparative example, and the reference example.

Referring to FIG. 6, in the case of the display device according to the embodiment example where the patterned high refractive pattern is disposed in each of the first pixel area and the third pixel area, it is observed that, unlike the comparative example, the light transmittance is less than about 20% in the wavelength range of about 380 nm to about 480 nm. In the case of the comparative example where the light control layer including the colorant is formed in an entire area of the first pixel area, the second pixel area, and the third pixel area, the colorant included in the light control layer may not have excessively low light transmittance in the wavelength range of about 380 nm to about 480 nm since the transmittance of the second pixel area emitting blue light is required to be above a certain level. However, since the high refractive pattern is patterned to overlap only the first pixel area and the third pixel area in the embodiment example, the high refractive pattern may include the colorant with high light absorption rate in the wavelength range of about 380 nm to about 480 nm. Accordingly, the light in the short wavelength region may be absorbed in the first pixel area and the third pixel area to prevent the light outside the target range from leaking and to provide high transmittance with respect to the red light and the green light. Thus, the color gamut may be improved, and the high display efficiency may be obtained.

Referring to FIGS. 7A and 7B, the display device according to the embodiment example shows a low reflectance over the wavelength range equal to or greater about 380 nm and equal to or smaller than about 780 nm compared with the display device according to the reference example that does not include the light control layer and shows a low reflectance in the wavelength range equal to or greater than about 380 nm and equal to or smaller than about 500 nm compared with the display device according to the comparative example. Since the high refractive pattern including the colorant with the high light absorption rate in the wavelength range of greater than or equal to about 380 nm and less than or equal to about 480 nm is patterned in the first pixel area and the third pixel area, the display device according to the embodiment example may have a low reflectance in the wavelength range of about 380 nm to about 480 nm. The reflectance may be relatively high in the wavelength range where the first pixel area and the third pixel area emit light, and thus, the red light and the green light may be more effectively reflected and reproduced. Accordingly, the display device including the high refractive pattern of the embodiment example may realize the high color gamut. For example, the display device according to the embodiment example may have a structure in which the high refractive pattern including the colorant with the high light absorption rate in the wavelength range of greater than or equal to about 380 nm and less than or equal to about 480 nm is patterned in the first pixel area and the third pixel area, and thus, the display device may have characteristics such as low reflectance, excellent color gamut, and high display efficiency.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:

1. A display device comprising:

a display panel;

a sensor layer disposed on the display panel; and a light control layer disposed on the sensor layer, wherein the display panel comprises:

a first pixel area emitting a first light and a second pixel area emitting a second light, a light emission wavelength of the second light being different from a light emission wavelength of the first light;

a light emitting element disposed on a base substrate; and an encapsulation layer disposed on the light emitting element, the light control layer comprises:

a high refractive pattern that overlaps the first pixel area in a plan view, does not overlap the second pixel area in a plan view, and comprises a first colorant; and an overcoat layer covering the high refractive pattern and overlapping the first pixel area and the second pixel area in a plan view, and a refractive index of the high refractive pattern is higher than a refractive index of the overcoat layer.

2. The display device of claim 1, wherein the first light is a red light, and the second light is a blue light.

3. The display device of claim 1, wherein the display panel further comprises a light blocking area defined adjacent to each of the first pixel area and the second pixel area, and the light control layer further comprises a light blocking portion overlapping the light blocking area in a plan view.

4. The display device of claim 3, wherein the high refractive pattern does not overlap the light blocking portion in a plan view.

5. The display device of claim 3, wherein the sensor layer comprises:

a sensor base layer disposed on the encapsulation layer;

a first conductive layer disposed on the sensor base layer;

an inorganic insulating layer disposed on the first conductive layer;

a second conductive layer disposed on the inorganic insulating layer; and an organic insulating layer disposed on the second conductive layer, and each of the first conductive layer and the second conductive layer overlaps the light blocking portion in a plan view.

6. The display device of claim 1, wherein the display panel further comprises a third pixel area emitting a third light having a light emission wavelength different from the light emission wavelengths of the first light and the second light, and the high refractive pattern overlaps the first pixel area and the third pixel area in a plan view.

7. The display device of claim 6, wherein the high refractive pattern comprises:

a first high refractive pattern overlapping the first pixel area and comprising a first-1 colorant; and a second high refractive pattern overlapping the third pixel area and comprising a first-2 colorant, and the first-1 colorant and the first-2 colorant comprise a same material.

8. The display device of claim 1, wherein the refractive index of the high refractive pattern is equal to or greater than about 1.6 and equal to or smaller than about 2.

9. The display device of claim 1, wherein the refractive index of the overcoat layer is equal to or greater than about 1.3 and equal to or smaller than about 1.54.

10. The display device of claim 1, wherein an angle between an upper surface of the sensor layer and a side surface of the high refractive pattern is equal to or greater than about 50 degrees and equal to or smaller than about 80 degrees.

11. The display device of claim 1, wherein the first colorant comprises at least one of a yellow pigment or a tetraazaporphyrin-based compound.

12. The display device of claim 1, wherein a light transmittance of the high refractive pattern is equal to or smaller than about 20% in a wavelength range of equal to or greater than about 380 nm and equal to or smaller than about 480 nm.

13. The display device of claim 1, wherein the high refractive pattern further comprises:

a base resin; and metal oxide nanoparticles, and the first colorant and the metal oxide nanoparticles are dispersed in the base resin.

14. The display device of claim 1, wherein the display panel further comprises an inorganic deposition layer disposed on the light emitting element and comprising an inorganic material having a refractive index equal to or greater than about 1.0 and a light absorption coefficient equal to or greater than about 0.5.

15. The display device of claim 1, wherein the light emitting element comprises:

a first electrode disposed on the base substrate;

a hole transport region disposed on the first electrode;

a light emitting layer disposed on the hole transport region;

an electron transport region disposed on the light emitting layer;

a second electrode disposed on the electron transport region; and a capping layer disposed on the second electrode.

16. The display device of claim 1, wherein the light emitting element comprises:

a first light emitting element comprising a first light emitting layer overlapping the first pixel area in a plan view and emitting the first light; and a second light emitting element comprising a second light emitting layer overlapping the second pixel area in a plan view and emitting the second light.

17. A display device comprising:

a display panel;

a sensor layer disposed on the display panel; and a light control layer disposed on the sensor layer, wherein the display panel comprises:

a first pixel area emitting a first light and a second pixel area emitting a second light, a light emission wavelength of the second light being different from a light emission wavelength of the first light;

a light emitting element disposed on a base substrate;

an inorganic deposition layer disposed on the light emitting element, comprising an inorganic material having a refractive index equal to or greater than about 1.0 and a light absorption coefficient equal to or greater than about 0.5, and overlapping the first pixel area and the second pixel area in a plan view; and an encapsulation layer disposed on the inorganic deposition layer, the light control layer comprises:

a high refractive pattern overlapping the first pixel area in a plan view; and an overcoat layer covering the high refractive pattern and overlapping the first pixel area and the second pixel area in a plan view, and a refractive index of the high refractive pattern is higher than a refractive index of the overcoat layer.

18. The display device of claim 17, wherein the display panel further comprises a third pixel area emitting a third light having a light emission wavelength different from the light emission wavelengths of the first light and the second light, and the high refractive pattern overlaps the first pixel area and the third pixel area and does not overlap the second pixel area in a plan view.

19. A display device comprising:

a display panel;

a sensor layer disposed on the display panel; and a light control layer disposed on the sensor layer, wherein the display panel comprises:

a first pixel area emitting a first light and a second pixel area emitting a second light, a light emission wavelength of the second light being different from a light emission wavelength of the first light;

a light emitting element disposed on a base substrate; and an encapsulation layer disposed on the light emitting element, the light control layer comprises:

a high refractive pattern overlapping the first pixel area in a plan view, having a light transmittance equal to or smaller than about 20% in a wavelength range of equal to or greater than about 380 nm and equal to or smaller than about 480 nm, and comprising at least one of a yellow pigment or a tetraazaporphyrin-based compound; and an overcoat layer covering the high refractive pattern and overlapping the first pixel area and the second pixel area in a plan view, and a refractive index of the high refractive pattern is higher than a refractive index of the overcoat layer.

20. The display device of claim 19, wherein the high refractive pattern further comprises:

a base resin in which the at least one of the yellow pigment or the tetraazaporphyrin-based compound is dispersed; and metal oxide nanoparticles dispersed in the base resin.

* * * * *